(12) United States Patent
Lin et al.

(10) Patent No.: US 7,446,355 B2
(45) Date of Patent: Nov. 4, 2008

(54) ELECTRICAL DEVICE AND METHOD FOR FABRICATING THE SAME

(75) Inventors: Shian-Jyh Lin, Taipei County (TW); Chien-Li Cheng, Hsin-Chu (TW); Pei-Ing Lee, Chang-Hua Hsien (TW); Chung-Yuan Lee, Tao-Yuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 11/556,170

(22) Filed: Nov. 3, 2006

(65) Prior Publication Data
US 2007/0161205 A1 Jul. 12, 2007

(30) Foreign Application Priority Data
Jan. 12, 2006 (TW) .............................. 95101275 A

(51) Int. Cl.
*H01L 29/76* (2006.01)
(52) U.S. Cl. ...................................... 257/288; 257/401
(58) Field of Classification Search ................. 257/350, 257/401, 341, 288, 204
See application file for complete search history.

(56) References Cited

U.S. PATENT DOCUMENTS

| 2002/0127798 A1* | 9/2002 | Prall ........................ 438/257 |
| 2007/0096185 A1* | 5/2007 | Kim et al. ................. 257/301 |
| 2008/0009112 A1* | 1/2008 | Lee et al. ................. 438/245 |

\* cited by examiner

*Primary Examiner*—Thao P. Le
(74) *Attorney, Agent, or Firm*—Winston Hsu

(57) ABSTRACT

A method of fabricating self-aligned recess utilizing asymmetric poly spacer is disclosed. A semiconductor substrate having thereon a first pad layer and second pad layer is provided. A plurality of trenches is embedded in a memory array region of the semiconductor substrate. Each of the trenches includes a trench top layer that extrudes from a main surface of the semiconductor substrate. Asymmetric poly spacer is formed on one side of the extruding trench top layer and is used, after oxidized, as a mask for forming a recess in close proximity to the trenches.

3 Claims, 7 Drawing Sheets

US 7,446,355 B2

ELECTRICAL DEVICE AND METHOD FOR FABRICATING THE SAME

BACKGROUND OF THE INVENTION

1. Field of the Invention

The present invention relates generally to method of fabricating an electrical device and, more particularly, to a method for fabricating gate trench for a metal-oxide-semiconductor (MOS) transistor device.

2. Description of the Prior Art

With the continuing shrinkage of device feature size, the so-called short channel effect (SCE) due to shrunk gate channel length has been found that it can hinder the integrity of integrated circuit chips. Many efforts have been made for solving this problem, for example, by reducing the thickness of the gate oxide dielectric or by increasing the doping concentration of source/drain. However, these approaches adversely affect the device reliability and speed of data transfer on the other hand, and are thus impractical.

A newly developed recessed-gate MOS transistor becomes most promising. In the filed of Dynamic Random Access Memory (DRAM), the recessed-gate technology may be used to improve the integrity of the memory chip. Typically, the recess-gate MOS transistor has a gate insulation layer formed on sidewalls and bottom surface of a recess formed in a substrate, a conductive filling the recess, contrary to a planar gate type transistor having a gate electrode formed on a planar surface of a substrate.

However, the aforesaid recess-gate MOS transistor has some shortcomings. For example, the recess for accommodating the gate of the MOS transistor is formed in a semiconductor wafer by using conventional dry etching methods. It is difficult to forming the recesses having the same depth across the wafer that a threshold voltage control problem arises. Further, as the width of the recess shrinks, the channel length is reduced, resulting in short channel effect.

SUMMARY OF THE INVENTION

It is one object of this invention to provide a method of fabricating a self-aligned gate trench for recess-gate MOS transistor devices in order to solve the above-mentioned problems.

According to the claimed invention, a method of fabricating self-aligned gate trench utilizing asymmetric spacer is disclosed. A semiconductor substrate having a main surface is provided. A pad oxide layer and a pad nitride layer are formed on the main surface. Deep trench capacitors are formed in the semiconductor substrate. Each of the deep trench capacitors has a trench top layer extruding from the main surface. The pad nitride layer is stripped off to expose the pad oxide layer and the trench top layer. A conformal liner layer is deposited on the semiconductor substrate. The liner layer covers the pad oxide layer and the trench top layer. A polysilicon layer is deposited on the liner layer. The polysilicon layer is anisotropically etched to form a polysilicon spacer on sidewall of the trench top layer. A tilt-angle ion implatation is performed to implant dopants into the polysilicon spacer at one side of the trench top layer. The polysilicon spacer at the other side of the trench top layer not ion implanted is selectively removed, thereby forming a single-side polysilicon spacer. The single-side polysilicon spacer is oxidized to form a silicon oxide spacer. Using the silicon oxide spacer as an etching hard mask and etching the liner layer, the pad oxide layer and the semiconductor substrate to form a gate trench therein.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
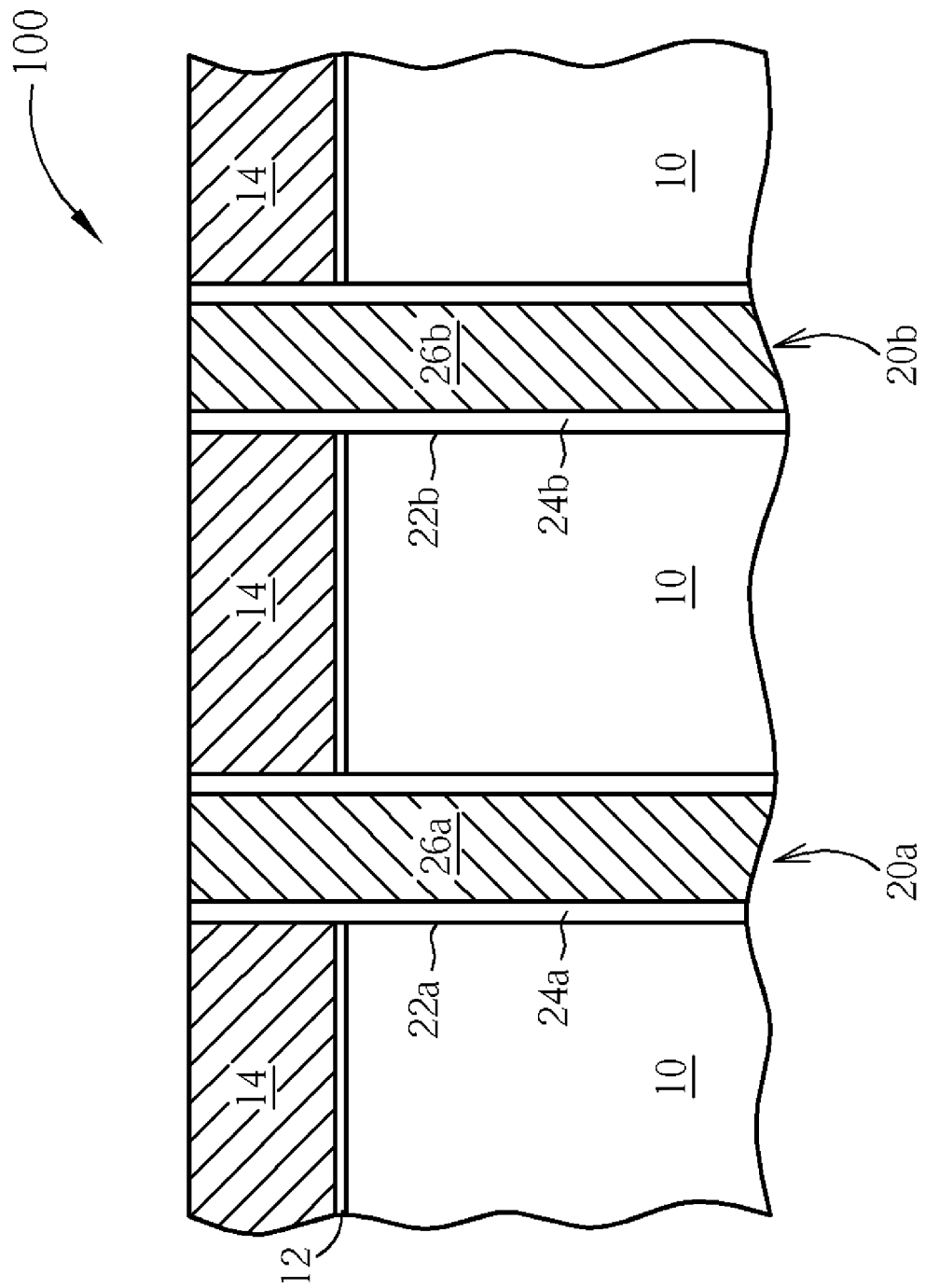
FIGS. 1-7 are schematic, cross-sectional diagrams illustrating a self-aligned method of fabricating a recess utilizing asymmetric spacer for recess-gate MOS transistor devices in accordance with one preferred embodiment of this invention.

FIGS. 1-7 are schematic, cross-sectional diagrams illustrating a self-aligned method of fabricating a recess utilizing asymmetric spacer for recess-gate MOS transistor devices in accordance with one preferred embodiment of this invention. As shown in FIG. 1, a substrate such as a semiconductor substrate 10, more particularly is a silicon substrate, silicon epitaxital substrate or Silicon-On-Insulator (SOI) substrate is provided. A first pad layer 12 is then deposited on or over the semiconductor substrate 10 such as oxide layer. A second pad layer 14 is then deposited on the first pad layer 12 as a mask is provided such as nitride layer. A trench structure such as deep trench capacitors 20a and 20b are formed in deep trench 22a and deep trench 22b, respectively, within a memory array area 100 of the semiconductor substrate 10.

The deep trench capacitor 20a comprises a sidewall oxide dielectric layer 24a and a doped polysilicon 26a. The deep trench capacitor 20b comprises a sidewall oxide dielectric layer 24b and a doped polysilicon 26b. The doped polysilicon 26a and the doped polysilicon 26b function as one capacitor electrode of the deep trench capacitors 20a and 20b, respectively.

For the sake of simplicity, only an upper portion of the deep trench capacitors 20a and 20b are shown in figures. It is understood that the deep trench capacitors 20a and 20b further comprises a buried plate acting as the other capacitor electrode, which is not shown.

Figure 2:
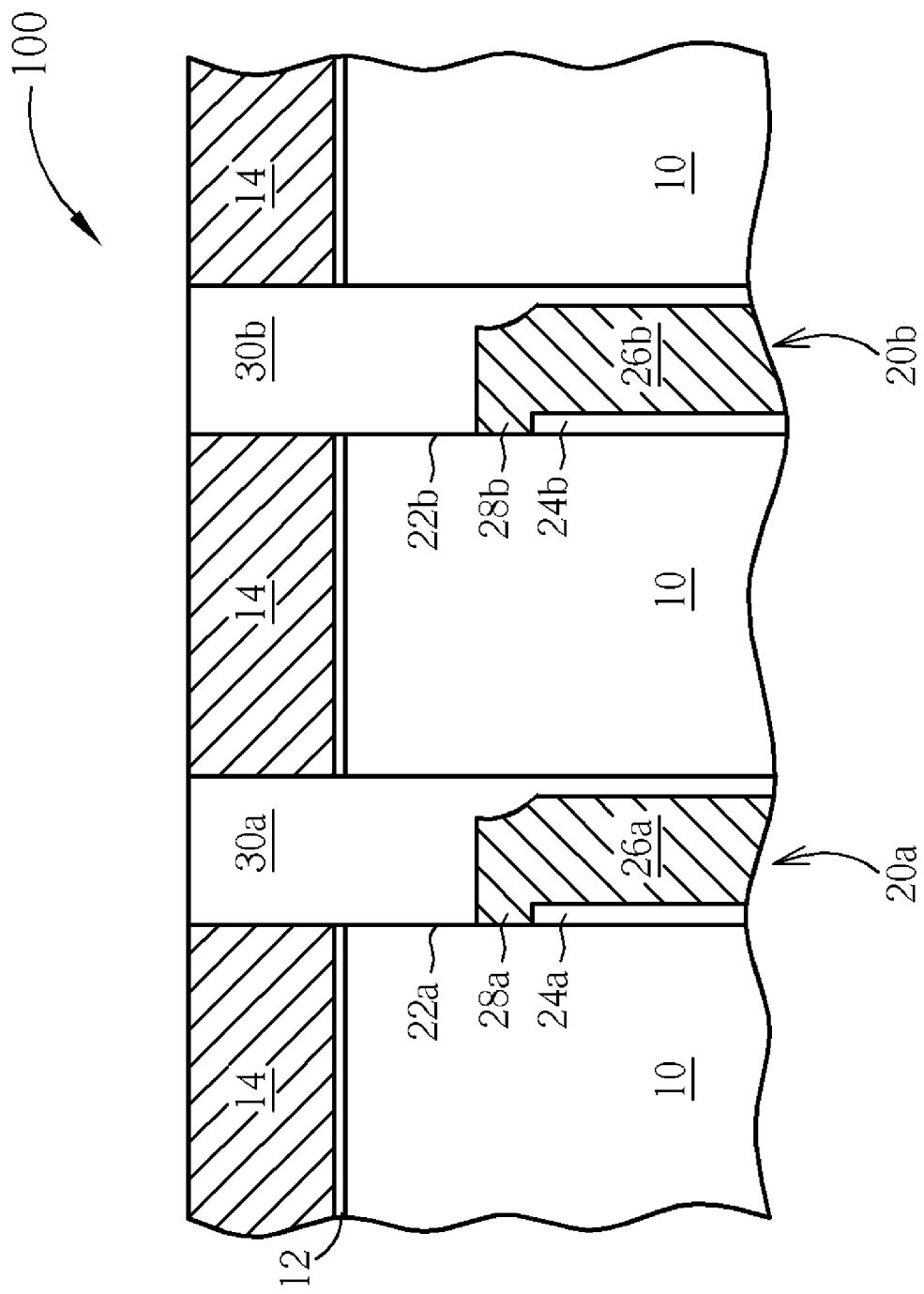

As shown in FIG. 2, a so-called Single-Sided Buried Strap (SSBS) process is carried out to form single-sided buried strap 28a and 28b in the upper portion of the deep trench capacitors 20a and 20b respectively. Subsequently, a Trench Top isolation Layer such as a Trench Top Oxide (TTO) layers 30a and 30b are formed to cap the single-sided buried strap 28a and 28b respectively. The TTO layers 30a and 30b extrude from a main surface of the semiconductor substrate 10.

The aforesaid SSBS process generally comprises the steps of etching back the sidewall oxide dielectric layer and the doped polysilicon (or so-called Poly-2) 26a and 26b to a first depth; refilling the recess with another layer of polysilicon (or so-called Poly-3); etching back the Poly-3 to a second depth; forming an asymmetric spacer on interior sidewall of the recess; etching away the Poly-3 and Poly-2 that are not covered by the asymmetric spacer; filling the recess with TTO insulation layer; and chemical mechanical polishing the TTO insulation layer.

Figure 3:
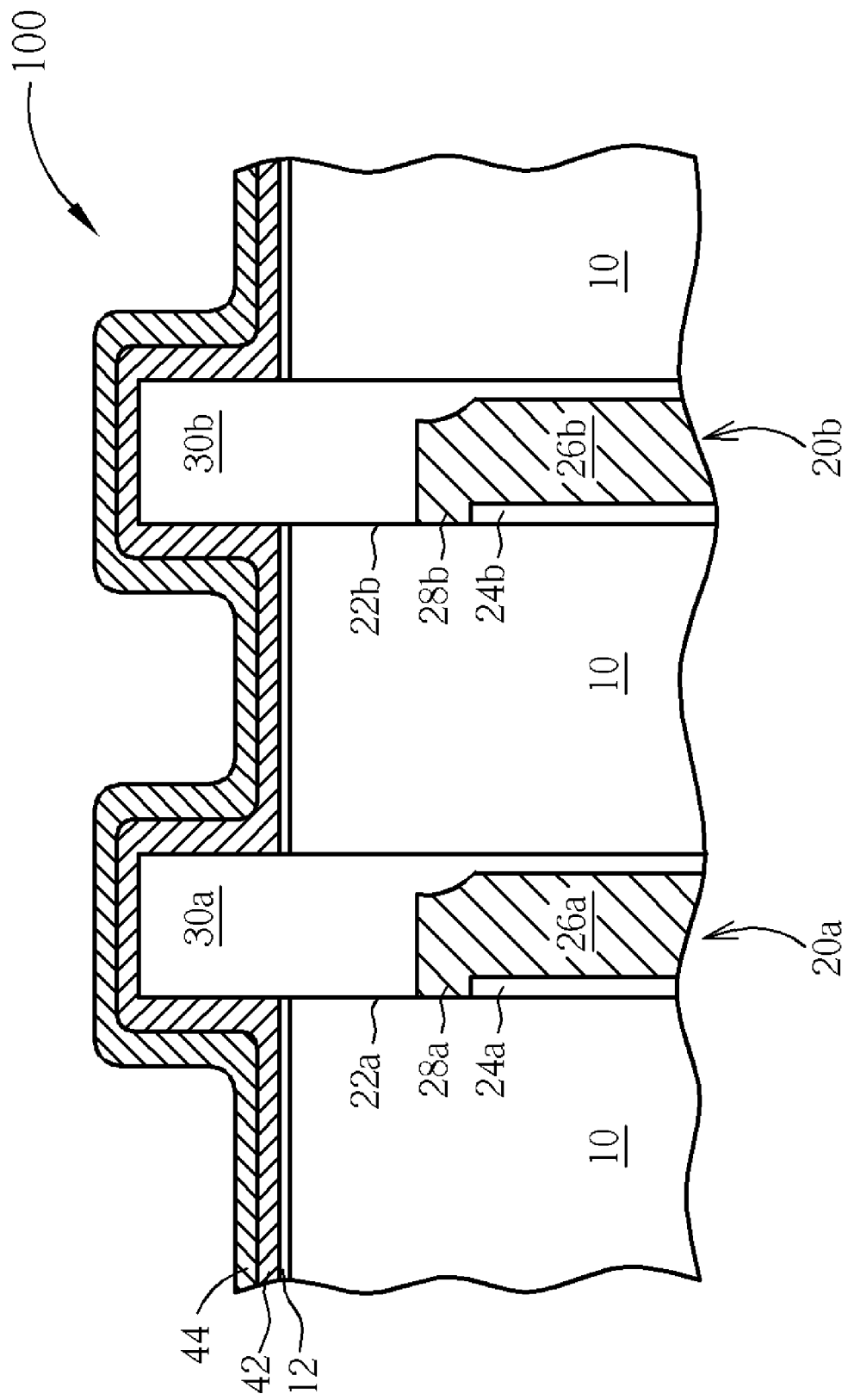

As shown in FIG. 3, after the formation of the SSBS 28a and 28b, the pad nitride layer 14 is stripped off by using methods known in the art, for example, wet etching solution such as heated phosphorus acid dipping, but not limited thereto.

A Chemical Vapor Deposition (CVD) process such as a Low-Pressure CVD (LPCVD) or Plasma-Enhanced CVD (PECVD), atomic layer deposition (ALD) is carried out to deposit a first liner layer could be as an isolation layer or a etch stop layer or a semiconductor layer such as silicon-oxy-nitride, alumina, polysilicon layer, silicon nitride, more particularly, silicon nitride liner 42 over or on the semiconductor substrate 10. According to the preferred embodiment of this invention, the silicon nitride liner 42 has thickness of about 50-500 angstroms, preferably 100-300 angstroms.

Another CVD process such as a LPCVD or PECVD or ALD is carried out to deposit a second liner layer that including silicon therein such as polysilicon layer 44 over or on the silicon nitride liner 42. According to the preferred embodiment of this invention, the polysilicon layer 44 has thickness of about 50-500 angstroms, preferably 100-200 angstroms.

Figure 4:
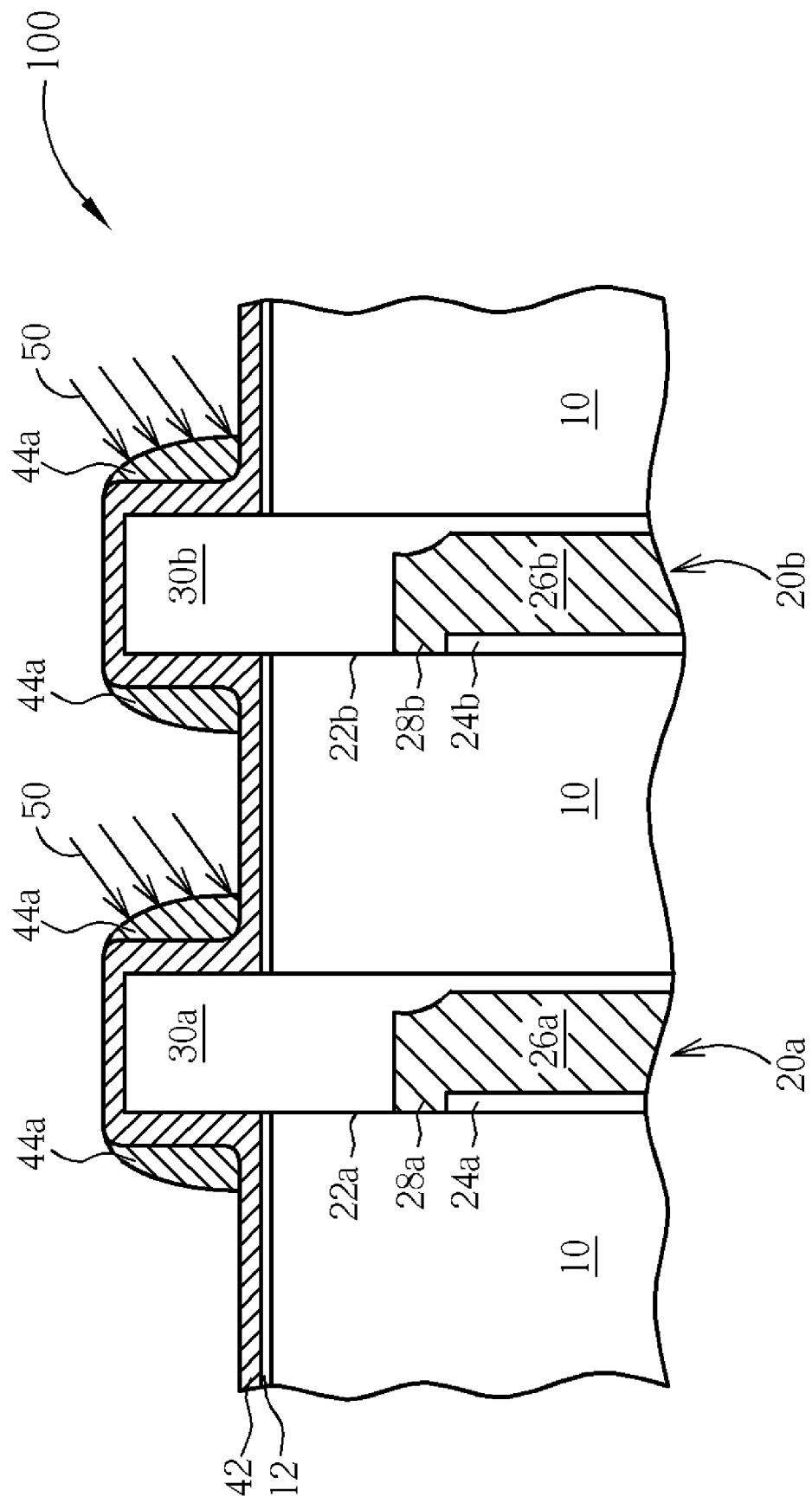

As shown in FIG. 4, an anisotropic dry etching process is then carried out to etch the polysilicon layer 44, thereby forming a structure of spacer, such as polysilicon spacer 44a encircling sidewall of the extruding TTO layers 30a and 30b. A drive-in treatment such as a tilt-angle ion implantation process 50 is performed to implant dopants such as $BF_2$ into the polysilicon spacer 44a adjacent to one side of the TTO layers 30a and 30b.

Figure 5:
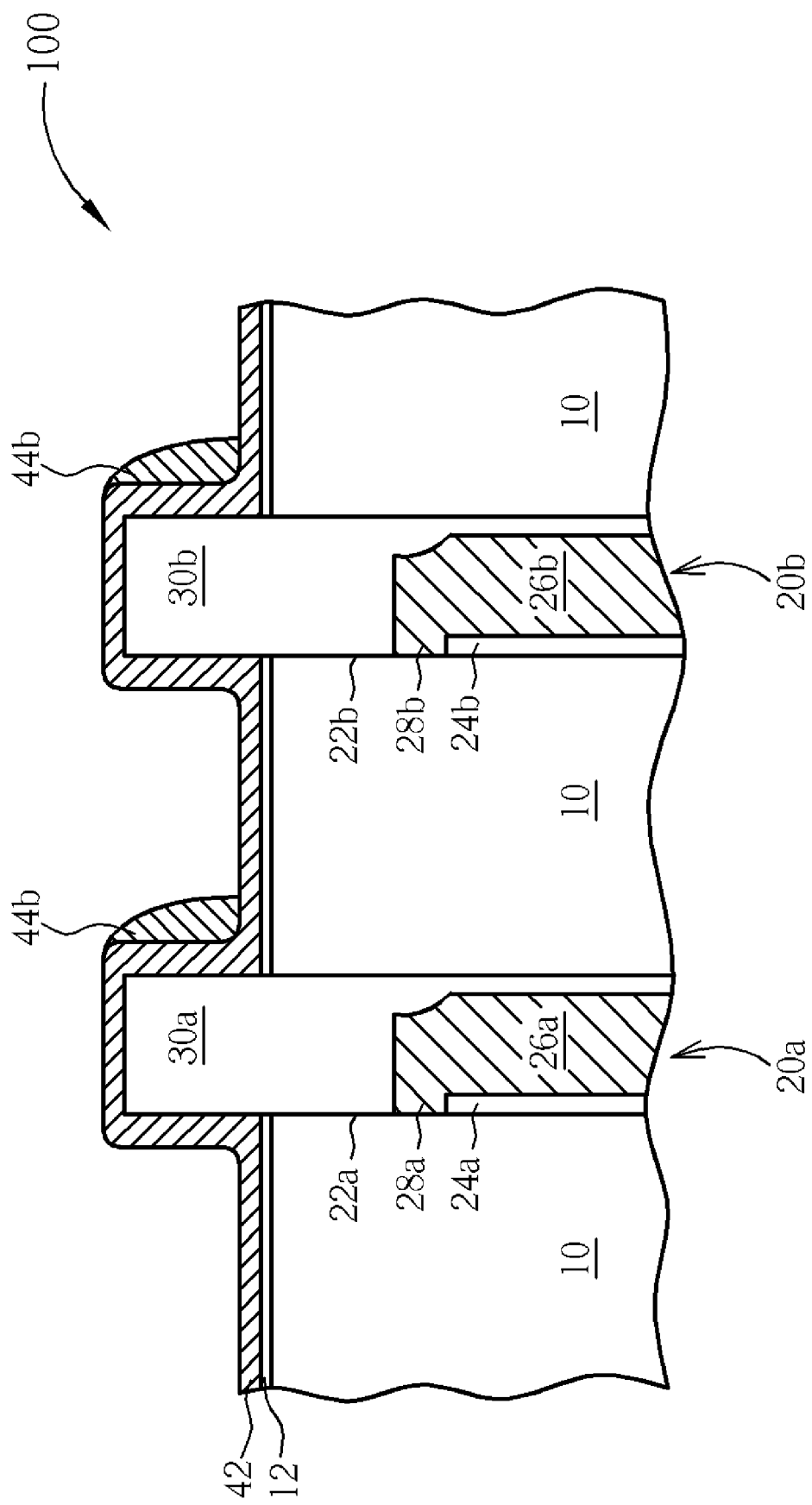

As shown in FIG. 5, the polysilicon spacer 44a is selectively etched. The polysilicon spacer 44a that is not doped with BF2 is removed from the sidewall of the TTO layers 30a and 30b, thereby forming an asymmetric spacer structure, such as single-sided polysilicon spacer 44b. It is noted that the formation of the single-sided polysilicon spacer 44b should not limited to the method disclosed in the preferred embodiment. The selective etching of the polysilicon spacer 44a may be accomplished by implanting dopants other than $BF_2$.

Figure 6:
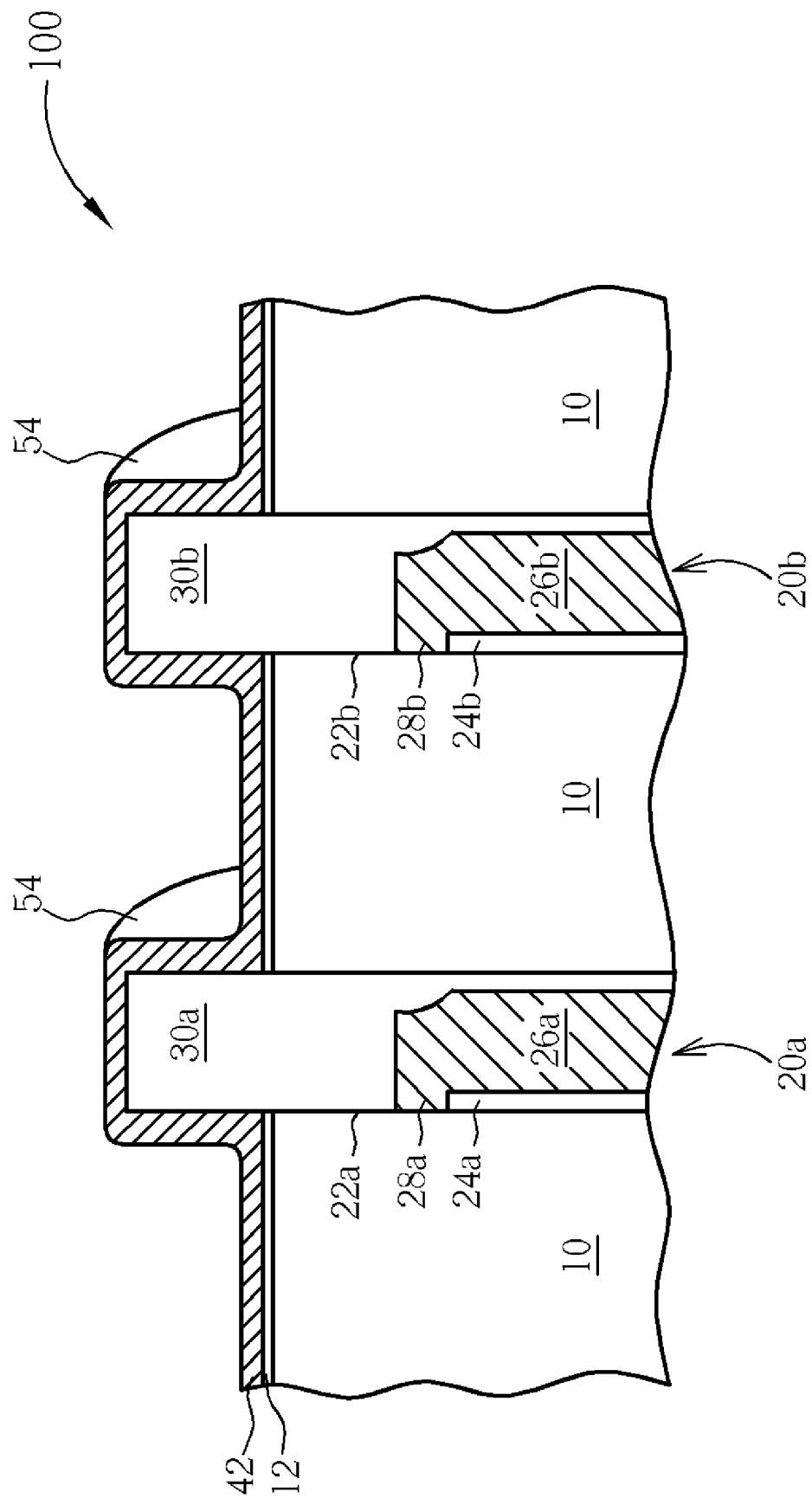

As shown in FIG. 6, an oxidation process is performed to oxidize the single-sided polysilicon spacer 44b, thereby forming a single-sided silicon oxide spacer 54. The volume of the spacer expands after oxidation. The volume expansion ratio from polysilicon to oxide is about 1.4 to 1.8.

Figure 7:
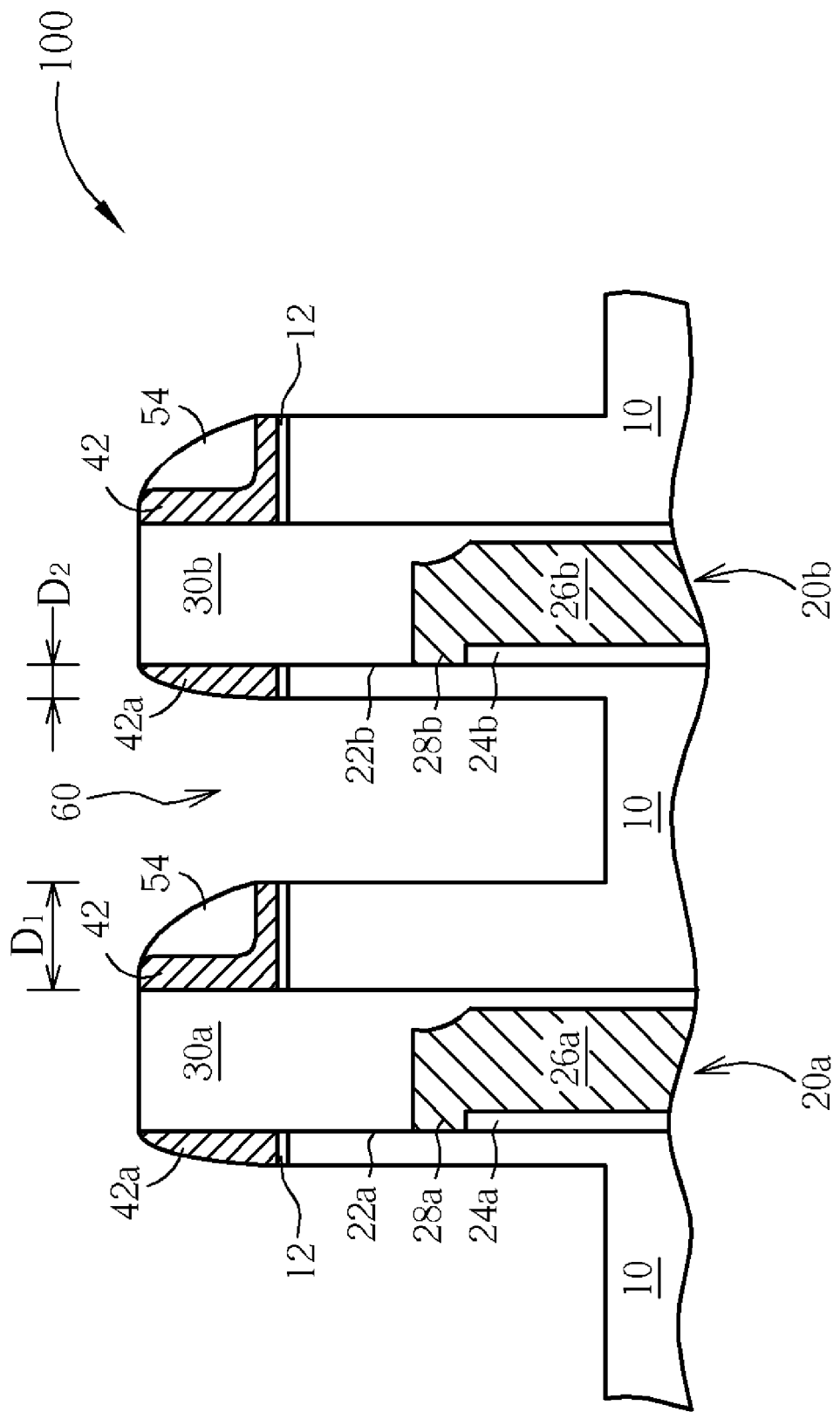

As shown in FIG. 7, an anisotropic dry etching process is carried out. Using the single-sided silicon oxide spacer 54 as an etching hard mask and etching the exposed silicon nitride liner 42 to form a silicon nitride spacer 42a on sidewall of the TTO layers 30a and 30b. Thereafter, the pad oxide layer 12 and the semiconductor substrate 10 are etched to a predetermined depth in a self-aligned manner, thereby forming a recess 60.

As specifically indicated in FIG. 7, a distance D1 that including distance of the single-sided silicon oxide spacer 54 and the remainder silicon nitride liner 42 between the edge of the recess 60 and the edge of the TTO layer 30a is greater than a distance D2 that including distance of the silicon nitride spacer 42a between the edge of the recess 60 and the TTO layer 30b because of the asymmetric spacer structure. But the distance D2 isn't small than 10 nm. By providing this feature, the process window for forming the source contact plug between the TTO layer 30a and the recess 60 is increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electrical device, comprising:
   a substrate including a main surface;
   a plurality of trenches embedded in said substrate, wherein each of said trenches including a trench top layer extruding from said main surface;
   a first spacer adjacent to a side of a first trench top layer;
   a second spacer adjacent to a side of a second trench top layer next to the first trench top layer; and
   a recess formed in said substrate and between said first spacer and said second spacer;
   wherein said first spacer is facing said second spacer and is different from said second spacer in structure.

2. The electrical device according to claim 1 wherein said first spacer including a first distance and said second spacer including a second distance, and
   wherein said first distance is greater than said second distance.

3. The electrical device according to claim 2 wherein said first distance is larger than 10 nm.

* * * * *